United States Patent [19]

Kushi et al.

[11] Patent Number: 5,322,762
[45] Date of Patent: Jun. 21, 1994

[54] PHOTOPOLYMERIZABLE COMPOSITION

[75] Inventors: Kenji Kushi; Chiho Tokuhara, both of Hiroshima, Japan

[73] Assignee: Mitsubishi Rayon Co., Ltd., Tokyo, Japan

[21] Appl. No.: 45,250

[22] Filed: Apr. 13, 1993

[30] Foreign Application Priority Data

Apr. 13, 1992 [JP] Japan .................................. 4-093179
Apr. 13, 1992 [JP] Japan .................................. 4-093180
Aug. 21, 1992 [JP] Japan .................................. 4-223061
Feb. 16, 1993 [JP] Japan .................................. 5-027022

[51] Int. Cl.$^5$ .................. C08F 2/50; C08F 20/20; G03F 7/031; G03F 7/105
[52] U.S. Cl. ................................. 430/288; 522/25; 522/26; 522/27; 522/29; 522/59; 522/75; 522/121; 522/15; 522/16; 430/915; 430/945; 430/947
[58] Field of Search .............. 430/288, 915, 945, 947; 522/15, 16, 25, 26

[56] References Cited

U.S. PATENT DOCUMENTS 3,109,736 11/1963 Sprague .................................. 96/90

FOREIGN PATENT DOCUMENTS 0382524 8/1990 European Pat. Off. .
1377288 9/1964 France .

OTHER PUBLICATIONS

Database WPI, Derwent Publications Ltd., AN-91-357889, JP-A-3 239 703, Oct. 25, 1991.
Database WPI, Derwent Publications Ltd., AN-84-191403, JP-A-59 107 344, Jun. 21, 1984.

Primary Examiner—Marion E. McCamish
Assistant Examiner—Arthur H. Koeckert
Attorney, Agent, or Firm—Oblon, Spivak, McClelland, Maier & Neustadt

[57] ABSTRACT

A highly stable photopolymerizable composition which is highly photosensitive to visible light, which can be hardened using a visible light laser, such as an argon laser, which provides excellent contrast between non-irradiated portions and the substrate under red light, and, moreover, which provides excellent contrast between the portions irradiated by the laser and the portions not irradiated. The photopolymerizable composition consists of 100 parts by weight of a resin which is hardenable under visible light having an irradiation energy mainly consisting of light rays in the 400 nm to 700 nm visible light region; 0.02 to 0.5 parts by weight of at least one dye selected from the group consisting of Victoria Pure Blue, anthraquinone dyes, monoazo dyes, and merocyanine dyes, these dyes having maximum absorption wavelengths from 550 to 700 nm; 0.1 to 5 parts by weight of the leuco dye 4,4'-(phenylmethylene bis[N,N-diethylbenzene amine]; and 0.1 to 5 parts by weight of tribromomethylphenyl sulphone.

3 Claims, No Drawings

PHOTOPOLYMERIZABLE COMPOSITION

FIELD OF THE INVENTION

The present invention relates to a photopolymerizable composition, and in particular, to a superiorly stable photopolymerizable composition which is highly photosensitive to visible light, which can be hardened by using a visible light laser, such as an argon ion laser, which provides excellent contrast between the non-irradiated portions and the substrate under red light, and, moreover, which provides excellent contrast between the portions irradiated by the laser and the portions not irradiated.

RELATED ART

Conventionally, in such photopolymerizable compositions as UV hardenable dry film photoresists, in order to provide good contrast between non-irradiated portions and the substrate, and good contrast under yellow light between the portions irradiated and the portions not irradiated by UV, a variety of dyes are blended into the photopolymerizable composition. For example, Japanese Laid-Open Patent Application No. 59-107344 discloses a system consisting of tribromomethylphenyl sulfone, Leuco Crystal Violet and Malachite Green.

However, visibility in these dye systems is poor under the red light which is necessary for the visible light hardenable resin. Thus, it is not possible to clearly distinguish between the portions irradiated by visible light and the portions not irradiated. Further, there is an additional disadvantage in that photosensitivity is decreased in these dye systems as compared to a system in which there are no added dyes.

Recently, accompanying advances in techniques to carry out light exposure using laser scanning, the development of a photopolymerizable composition which is highly photosensitive to the wavelengths transmitted from a visible light laser, such as an argon laser, has been greatly desired. As a result, a variety of such photosensitive resins and initiating compounds have been proposed.

For example, Japanese Laid-Open Patent Application No. 3-239703 discloses that photosensitivity can be improved by utilizing a mixture of a coumarin compound of a specified structure and a titanocene compound shown by the following general formula (1):

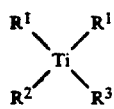  (1)

[Wherein:

$R^1$ represents respectively and independently, 4,5,6,7 tetrahydroindenyl−, indenyl−, or cyclopentadienyl− which is either non-substituted or substituted with an alkyl having 1 to 6 carbon atoms or an alkoxy having 1 to 6 carbon atoms, or alternatively, respective $R^1$ groups may be joined to form a compound as represented by the following formula (2) below, wherein $R^4$ and $R^5$ represent respectively and independently, hydrogen or methyl;

  (2)

$R^2$ is an aromatic ring with a 6-membered carbon ring or with a 5- or 6-membered hetero ring, wherein at least one of the two ortho positions of the metal-carbon bond is substituted with a fluorine atom or a —$CF_2R$ group (in the formula, R is fluorine or methyl);

$R^3$ is identical to $R^2$, or is a halogen atom, —$OR^6$ or —$OR^7$ (wherein, $R^6$ is hydrogen, an alkyl having 1 to 6 carbon atoms, phenyl, acetyl, or trifluoroacetyl, and $R^7$ is an alkyl having 1 to 6 carbon atoms or phenyl), or is a group shown by formula (3) which is formed by joining $R^2$ and $R^3$ (wherein, Q is an aromatic ring with a 6-membered carbon ring or with a 5- or 6-membered hetero ring, wherein each two bonds are in an ortho position with respect to Y, each meta position with respect to Y is substituted with a fluorine atom or with a —$CF_2R$ group, and Y is a direct bond, —O—, —S—, —$SO_2$—, —CO—, —$CH_2$—, or —$C(CH_3)_2$—.)]

  (3)

However, when utilizing the above photopolymerizable composition, for example, when making a printed circuit, it was desirable that it be possible to confirm the presence or absence of the resist on the substrate under red light. Moreover, in order to discriminate between the portions exposed to light and the portions not exposed, and in order to avoid overlapping exposure, it was also desirable that there be provided good contrast between the portions irradiated by the laser and the portions not irradiated.

SUMMARY OF THE INVENTION

It is an object of the present invention to provide a photopolymerizable composition, and in particular, to provide a superiorly stable photopolymerizable composition which is highly photosensitive to visible light, which can be hardened by using a visible light laser, such as an argon ion laser, which provides excellent contrast between the non-irradiated portions and the substrate under red light, and, moreover, which provides excellent contrast between the portions irradiated by the laser and the portions not irradiated.

As the result of vigorous research directed at achieving the above stated objective, the inventors of the present invention discovered a photopolymerizable composition comprising a combination of: 100 parts by weight of a resin which is hardenable under visible light which has an irradiation energy mainly of light rays in the visible light region of 400 nm to 700 nm; 0.02 to 0.5 parts by weight of at least one dye selected from the group consisting of Victoria Pure Blue, anthraquinone dyes, monoazo dyes, merocyanine dyes and phthalocyanine dyes, which have a maximum absorption wavelength from 550 to 700 nm; 0.1 to 5 parts by weight of 4,4'-(phenylmethylene) bis[N,N-diethylbenzene amine] (also known commonly by the name Leuco Diamond Green); 0.1 to 5 parts by weight of tribromomethylphenyl sulfone. This photopolymerizable composition is highly photosensitive to visible light, can be hardened by using a visible light laser such as an argon ion laser, provides excellent contrast under red light between the non-irradiated portions and the substrate, and, moreover, provides excellent contrast between the portions irradiated by the laser and the portions not irradiated.

The photopolymerizable composition of the present invention comprises 100 parts by weight of a resin which is hardenable under visible light having an irradiation energy mainly consisting of light rays in the 400 nm to 700 nm visible light region; 0.02 to 0.5 parts by weight of at least one dye selected from the group consisting of Victoria Pure Blue, anthraquinone dyes, monoazo dyes, merocyanine dyes and phthalocyanine dyes, these dyes having a maximum absorption wavelength from 550 to 700 nm; 0.1 to 5 parts by weight of the leuco dye 4,4'-(phenylmethylene) bis[N,N-diethylbenzene amine]; and 0.1 to 5 parts by weight of tribromomethylphenyl sulfone.

The photopolymerizable compositions of the present invention are highly photosensitive to visible light rays, can be hardened by using a visible light laser such as an argon ion laser, provide excellent contrast under red light between the non-irradiated portions and the substrate, and, moreover, provide excellent contrast between the portions irradiated by the laser and the portions not irradiated. Accordingly, the photopolymerizable compositions of the present invention are extremely useful for application in the resists for forming the printed circuits used in visible light lasers, or in print making materials.

DETAILED DESCRIPTION OF THE INVENTION

A detailed description of the present invention follows below.

As resins which are hardenable under visible light, there are available compositions consisting of a photocrosslinkable polymer and a photo sensitizing agent, compositions consisting of a cationic polymerizable compound and a photosensitive photocation polymerization initiator, and compositions consisting of a photosensitive resin containing at least one addition polymerizable compound having ethylenic unsaturated bonds, and a photosensitive photopolymerization initiator, among others. Of these, from the aspect of hardening speed, preferable is a composition consisting of a photosensitive resin containing at least one addition polymerizable compound having ethylenic unsaturated bonds, and a photosensitive photopolymerization initiator.

As the photosensitive photopolymerization initiator used in the visible light hardenable resin which constitutes the photopolymerizable composition of the present invention, a combination of, for example, compound (a) shown by the following general formula (1), compound (b) shown by the following general formula (4), and/or compound (c) shown by the following general formula (5), may be used.

Compound (a) is a compound as shown by the following general formula (1).

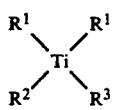

[Wherein:
$R^1$ represents respectively and independently, 4,5,6,7 tetrahydroindenyl⁻, indenyl⁻, or cyclopentadienyl⁻ which is either non-substituted or substituted with an alkyl having 1 to 6 carbon atoms or an alkoxy having 1 to 6 carbon atoms, or alternatively, respective $R^1$ groups may be joined to form a compound as represented by the following formula (2) below, wherein $R^4$ and $R^5$ represent respectively and independently, hydrogen or methyl;

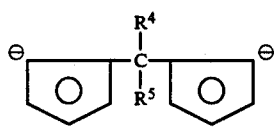

$R^2$ is an aromatic ring with a 6-membered carbon ring or with a 5- or 6-membered hetero ring, wherein at least one of the two ortho positions of the metal-carbon bond is substituted with a fluorine atom or is a $-CF_2R$ group (in the formula, R is fluorine or methyl);

$R^3$ is identical to $R^2$, or is a halogen atom, $-OR^6$ or $-OR^7$ (wherein $R^6$ is hydrogen, an alkyl having 1 to 6 carbon atoms, phenyl, acetyl, or trifluoroacetyl, and $R^7$ is an alkyl having 1 to 6 carbons atoms or phenyl), or is a group shown by formula (3) which is formed by joining $R^2$ and $R^3$

(wherein, Q is an aromatic ring with a 6-membered carbon ring or an aromatic ring with a 5- or 6-membered hetero ring, wherein each two bonds are in an ortho position with respect to Y, each meta position with respect to Y is substituted with a fluorine atom or a $-CF_2R$ group, and Y is a direct bond, $-O-$, $-S-$, $-SO_2-$, $-CO-$, $-CH_2-$, or $-C(CH_3)_2-$.);

Compound (b) is a compound shown by the following general formula (4).

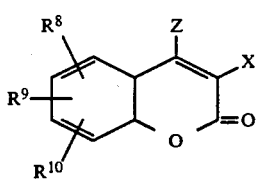

[Wherein:
$R^8$, $R^9$, and $R^{10}$ are represent respectively and independently, hydrogen atom, chlorine atom, a lower alkoxy group, lower dialkyl amino group, lower dialkenyl amino group, or alicyclic amino group. Alternatively, when joined, $R^8$, $R^9$, and $R^{10}$ represent a substituted or non-substituted alicyclic amino group. X indicates a heterocyclic group, non-substituted or substituted with a total of 5 to 9 carbon atoms and hetero atoms. Z indicates a hydrogen atom or amino group.]

Preferable in particular as the above compound are the compounds (8), (9) and (10) shown by the following formulas.

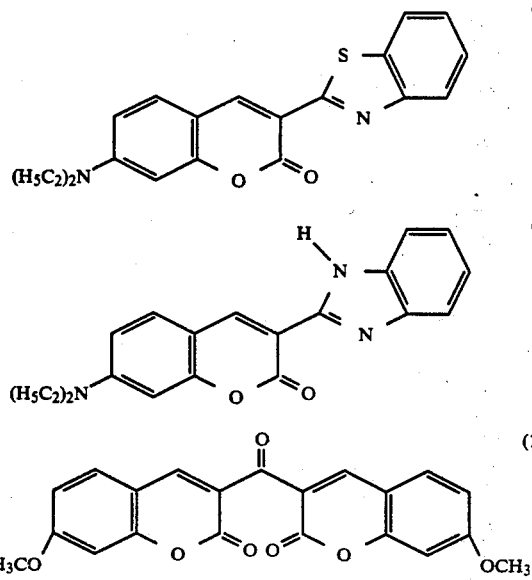

Compound (c) is a compound as shown by the following general formula (5).

[Wherein:
R[11] indicates phenyl group or substituted phenyl group, and R[12] indicates hydrogen atom, lower alkyl group, chlorine atom or lower alkoxy group.]

Compound (a) alone may be used in the visible light hardenable resin, however, from the aspect of obtaining high photosensitivity, its use in combination with compound (b) or compound (c) is preferable. Should even higher photosensitivity be desired, compounds (a), (b) and (c) may be used together.

When combining photopolymerization initiators (a), (b) and (c) in the visible light hardenable resin of the present invention, it is preferable that, of the 100 percent by weight of visible light hardenable resin, the combination of photopolymerization initiators (a), (b) and (c) be 10 to 1 percent by weight thereof. If the proportions at which these three components are used is less than the lower limit of the aforementioned range, photosensitivity easily decreases. Moreover, even if the proportions at which these three components are used is greater than the upper limit of the above stated range, not only is it difficult to increase photosensitivity, but also, the physical characteristics of the resin easily decrease.

Further, it is preferable to set the ratio of the combination (weight ratio) of compound (b) to compound (a) so that (b)/(a) is 1 or less. When the ratio of the combination of these two components becomes greater than 1, there is a tendency for the characteristics of the hardened resin to deteriorate. Additionally, it is preferable to set the ratio of the combination (weight ratio) of compound (c) to compound (a) so that (c)/(a) is 10 or less. When the ratio of the combination of these two components exceeds 10, photosensitivity tends to decrease, and, moreover, is not desirable from the aspect of maintaining stability in storage.

The photosensitive resin containing at least one addition polymerizable compound containing ethylenic unsaturated bonds may consist of only an addition polymerizable compound containing ethylenic unsaturated bonds, or may comprise an addition polymerizable compound containing ethylenic unsaturated bonds and a binder resin such as a polymer or the like.

A monomer, oligermer, or prepolymer having ethylenic unsaturated bonds which will effect addition polymerization by the application of a photopolymerization initiator are acceptable as the addition polymerizable compound containing ethylenic unsaturated bonds. However, from the aspect of achieving a high polymerization reaction, a compound containing acryloyloxy group or methacryloyloxy group (hereinafter referred to as (meth)acryloyloxy group) is particularly preferable.

As examples of the monomer containing the aforementioned (meth)acryloyloxy group, available are polyether acrylates or polyether methacrylates ("acrylate" or "methacrylate" will be referred to below simply as "(meth)acrylate)", polyester (meth) acrylates, polyoyl (meth) acrylates, epoxy (meth) acrylates, amidourethane (meth) acrylates, urethane (meth) acrylates, spiroacetal (meth) acrylates and polybutadiene (meth) acrylates, among others.

As concrete examples of these kinds of monomers or oligmers there are available:

triethylene glycol diacrylate, hexapropylene glycol diacrylate, or polyether (meth) acrylate synthesized from 1,2,6-hexanetriol/propylene oxide/acrylic acid, or from trimethylolpropane/propylene oxide/acrylic acid;

polyester (meth) acrylate synthesized from adipic acid/1,6-hexanediol/acrylic acid, or from succinic acid/ trimethylolethane/acrylic acid;

polyol (meth) acrylates or (meth) acrylates such as neopentyl glycol diacrylate, 1,4-butanediol dimethacrylate, 2-ethylhexyl acrylate, tetrahydrofurfuryl acrylate, 2-hydroxyethyl methacrylate, ethyl carbitol acrylate, trimethylolpropane triacrylate, pentaerythritol tetraacrylate, dipentaerythritol tetraacrylate, dipentaerythritol pentaacrylate, 2,2-bis(4-acryloyloxy diethoxyphenyl)propane, and 2,2-bis(4-acryloyl oxypropoxyphenyl) propane;

epoxy (meth) acrylate synthesized from diglycidyl etherified bisphenol A/acrylic acid, from diglycidyl etherified polybisphenol A/acrylic acid, or from triglycidyl etherified glycerine/acrylic acid;

amidourethane (meth) acrylate synthesized from γ-butyrolactone/N-methylethanolamine/bis(4-isocyanate cyclohexyl)methane/2-hydroxyethylacrylate, or from γ-butyrolactone/N-methylethanolamine/2,6-tolylene diisocyanate/tetraethylene glycol/2-hydroxyethylacrylate;

urethane acrylates such as 2,6-tolylenediisocyanate diacrylate, isophorone diisocyanate diacrylate, and hexamethylene diisocyanate diacrylate; and spiroacetal acrylates synthesized from diallylidene pentaerythritol/2-hydroxyethyl acrylate; and acrylated polybutadiene synthesized from epoxidated butadiene/2-hydroxyethyl acrylate.

These monomers and oligomers may be used alone or in combinations of two or more.

Further, these monomers and oligomers can be combined and blended with a binder resin. The purpose of binder resin is to add a variety of functional abilities such as developing characteristics, binding ability with the substrate, and flexibility. Optimal selection of the binder resin may be made in response to the desired objectives. For example, polyvinyl pyrrolidone, polyvinyl alcohol, (meth) acrylate•(meth) acrylic acid copolymer, styrene•(meth) acrylic acid copolymer, styrene•maleic acid copolymer, and (meth) acrylate•(meth) acrylamide copolymer, can be used.

Only one of these polymers may be used, or a mixture of two or more at an appropriate ratio is also possible.

When using the visible light hardenable photopolymerizable composition as the dry film resist in alkali development, it is preferable that the visible light hardenable resin be one consisting of:

40 to 70 parts by weight of a thermoplastic polymer (d) for use in a binder, wherein 15 to 30 percent by weight of at least one monomer containing an $\alpha,\beta$ unsaturated carboxyl group having 3 to 15 carbon atoms is copolymerized with 85 to 70 percent by weight of other copolymerizable monomer therewith;

25 to 50 parts by weight of a cross-linking monomer (e) containing two or more ethylenic unsaturated groups within the molecule;

0.5 to 10 parts by weight of a visible light photopolymerization initiator (f).

Further it is preferable that the aforementioned cross-linking monomer (e) contains 15 to 10 percent by weight of the compound shown by the general formula (6) below, 0 to 85 percent by weight of the compound shown by the general formula (7) below, and, moreover, that total percent by weight for the compound shown by general formula (6) and the compound shown by general formula (7) be 65 percent by weight or more with respect to the cross-linking monomer (e).

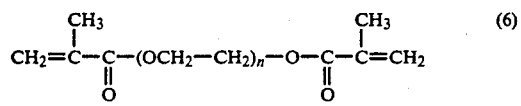

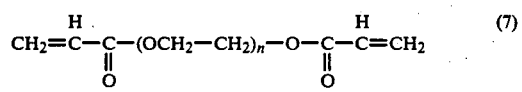

[n is a positive integer in the range of 4 to 9]

So that developing can be performed with an aqueous alkali solution such as sodium carbonate, it is preferable to constitute the thermoplastic polymer (d) for use in the binder by copolymerizing monomers which contain one or more monomers having an $\alpha, \beta$ unsaturated carboxyl group with 3 to 15 carbon atoms at a proportion of 15 to 30 percent by weight. Available as examples of the applicable carboxylic acid monomer are acrylic acid, methacrylic acid, cinnamic acid, crotonic acid, sorbic acid, itaconic acid, propiolic acid, maleic acid and fumaric acid. Moreover, preferable are partial esterifications or anhydrides of these. It is desirable that these carboxylic acid components be applied so that their content in the copolymer is within the limits of 15 to 30 percent by weight, and preferably 15 to 25 percent by weight. In a composition wherein the percent by weight of the carboxylic acid in the copolymer is less than 15 percent by weight, a reduction in productivity occurs because developing using an alkali solution becomes difficult and the time required for developing becomes longer. On the other hand, in a composition wherein the percent by weight of the carboxylic acid in the copolymer exceeds 30 percent by weight, the developing time becomes extremely short and it becomes difficult to exercise control over the development in order to obtain a pattern with a high degree of image dissection. Moreover, the water resistance of the hardened portion is reduced.

It is preferable to include other copolymerizable components selected from the group consisting of the compounds represented by the following general formula (11) and the ring substituted derivatives thereof as the other copolymerizable components constituting the thermoplastic polymer for use in the binder of which the composition of the present invention consists.

[Wherein: $R^{13}$ in the formula is an alkyl group having 1 to 6 carbon atoms, or a halogen atom.]

The hydrogen of the benzene ring in this substance may be substituted with a functional group such as a nitro group, alkoxy group, acyl group or halogen, and the substituted remaining bases of the benzene ring may be within the range of 1 to 5. Preferable substituent groups are simple alkyl groups such as methyl group or t-butyl group. Of these compounds, most preferable is styrene.

It is preferable to copolymerize these polymerizable components so that their content in the thermoplastic copolymer for use in the binder is within the limits of 2 to 25 percent by weight thereof. In a composition wherein the percent by weight of the copolymerized components is less than 2 percent by weight, it is difficult to obtain a resist material having superior resistance to chemicals and the ability to withstand plating. In contrast, in a composition wherein the percent by weight of the copolymerized components exceeds 25 percent by weight, the resist resin layer of the obtained dry film resist becomes too hard and peeling off of the substrate resist readily occurs.

As the other copolymerizable components constituting the thermoplastic polymer for use in the binder of which the composition of the present invention consists, there are available alkyl acrylates having an alkyl group having 1 to 8 carbon atoms, and hydroxy alkyl acrylates having hydroxy alkyl groups having 2 to 8 carbon atoms. Methyl acrylate, ethyl acrylate, n-propyl acrylate, iso-propyl acrylate, n-butyl acrylate, sec-butyl acrylate, t-butyl acrylate, 2-hydroxyethyl acrylate, 2-hydroxypropyl acrylate, 2-ethylhexyl acrylate, and the like are available as examples of these compounds. Of these compounds, most preferable are methyl acrylate, ethyl acrylate, n-butyl acrylate, and 2-ethylhexyl acrylate. When considering achieving an appropriate degree of flexibility for the visible light hardenable photopolymerizable composition of the present invention, it is preferable to copolymerize these acrylate components so that they comprise 10 to 40 percent by weight of the thermoplastic copolymer for use in the binder. With a composition wherein the content of the acrylate component is less than 10 percent by weight, it is not possible to obtain a dry film resist having sufficient flexibility. The resist resin's ability to bind to the substrate and to fill in the irregularities in the surface of the substrate material is not sufficient, and the resist's ability to withstand plating decreases. On the other hand, in a composition wherein the content of the copolymerizable composition of the aforementioned polymerizable substance exceeds 40 percent by weight, then the resist resin becomes too soft and results in the so-called cold flow developing where the resist resin runs out from between the support films when rolling and storing the obtained dry film resist.

As the polymerizable components which can be copolymerized in the thermoplastic copolymer for use in the binder, available are alkyl methacrylates having 1 to 8 carbons atoms, and hydroxyalkyl methacrylates having 2 to 8 carbon atoms. Methyl methacrylate, ethyl methacrylate, n-propyl methacrylate, isopropyl methacrylate, n-butyl methacrylate, sec-butyl methacrylate, t-butyl methacrylate, 2-hydroxymethyl methacrylate, 2-hydroxyethyl methacrylate 2-hydroxypropyl methacrylate, 2-ethylhexyl methacrylate and the like are available as examples of these compounds. Of these compounds, most preferable is methyl methacrylate. These methacrylate components are copolymerized with alkyl acrylates or with hydroxy acrylates in order to provide an appropriate crystallization temperature to the thermoplastic polymer for use in the binder. It is preferable that these components be copolymerized so that the content thereof in the thermoplastic copolymer for use in the binder is within the range of 30 to 65 percent by weight.

It is preferable that the average molecular weight of the thermoplastic polymer used in the binder polymer used in the present invention is within the limits of 40,000 to 500,000. If the average molecular weight is less than 40,000, cold flow development occurs easily when the dry film resist is formed. In contrast, when the average molecular weight exceeds 500,000, then solubility with respect to the alkali developing solution of the portion not exposed to light is insufficient. As a result, developing ability is degraded and too much time is required for development. Thus, the degree of image dissection and the ability to produce the circuit pattern decrease easily.

40 to 70 parts by weight, and preferably 50 to 70 parts by weight, of the thermoplastic polymer for use in the binder used in the present invention are contained in 100 parts by weight of the photopolymerizable resin composition. A photopolymerizable resin composition wherein the content of the thermoplastic polymer for use in the binder is less than 40 parts by weight has poor manageability due to the fact that the obtained dry film resist has strong adhesive properties and, at room temperature, sticks to the substrate in the absence of any application of pressure. Further, the film forming ability is also impaired, it is not possible to obtain a sufficient degree of film strength and cold flow occurs easily. In contrast, when the content of the thermoplastic polymer exceeds 70 parts by weight, the dry film resist obtained has low adhesive properties, and there is incomplete adhesion to the substrate following lamination. Further, the visible light hardened film becomes brittle, the strength of the adhesion to the substrate is impaired, and sufficient chemical resistance and, in particular, sufficient ability to withstand plating and etching, cannot be obtained.

It is preferable that cross-linking monomer (e), which has two or more ethylenic unsaturated groups in a single molecule, contain the compound shown by general formula (6) below in an amount of 15 to 100 percent by weight.

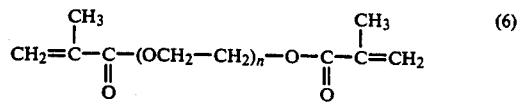

[Wherein, n is a positive integer in the range of 4 to 9.]

n in general formula (6) is a positive integer in the range of 4 to 9, and preferably 4 or 5. If a compound wherein n is 3 or less is used, there is a tendency for the photosensitivity of the dry film resist ultimately obtained from the photopolymerizable composition to decrease, and, moreover, cold flow occurs readily. Further, because the cross-linking density is too high, the light hardened film becomes brittle, the strength of the adhesion to the substrate is easily impaired, and it becomes difficult to obtain sufficient chemical resistance, and in particular, to obtain sufficient ability to withstand plating and etching. When a compound wherein n is 4 or 5 is used, the dry film resist ultimately obtained consisting of the photopolymerizable composition displays maximum photosensitivity. In contrast, when a compound wherein n is 10 or more is used, the photosensitivity of the obtained dry film resist shows a tendency to decrease, and further, the hardness of the hardened film tends to be insufficient.

It is preferable that the compound represented by formula (6) be contained in an amount of 15 to 100 percent by weight, and more preferably in the amount of 20 to 40 percent by weight, in the cross-linking monomer (e) which contains two or more ethylenic unsaturated groups in a molecule and forms the composition of the present invention. In a dry film resist obtained by using a cross-linking monomer (e) wherein the content of the compound represented by the above general formula (6) is less than 15 percent by weight, following peeling of the hardened resist using a strong alkali solution, the hardened resist peelings dissolve easily in the peeling fluid and, thus, this is not desirable.

It is preferable that the cross-linking monomer (e), which has two or more ethylenic unsaturated groups in a single molecule and of which the composition of the present invention consists, contain the compound represented by general formula (7) below in an amount of 0 to 85 percent by weight.

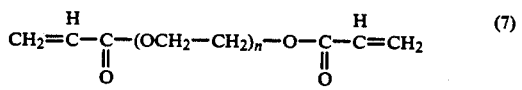

[Wherein, n is a positive integer in the range of 4 to 9.]

n in general formula (7) is a positive integer in the range of 4 to 9, and preferably 4 or 5. If a compound wherein n is 3 or less is used, there is a tendency for the photosensitivity of the dry film resist ultimately obtained from the photopolymerizable composition to decrease, and, moreover, cold flow occurs readily. Further, because the cross-linking density is too high, the light hardened film becomes brittle, the strength of the adhesion to the substrate is easily impaired, and it becomes difficult to obtain sufficient chemical resistance, and in particular, to obtain sufficient ability to withstand plating and etching. When a compound wherein n is 4 or 5 is used, the dry film resist ultimately obtained consisting of the photopolymerizable composition displays maximum photosensitivity. In contrast, when a compound wherein n is 10 or more is used, the photosensitivity of the obtained dry film resist shows a tendency to decrease, and further, the hardness of the hardened film tends to be insufficient.

It is preferable that the compound represented by general formula (7) be contained in an amount of 0 to 85 percent by weight, and more preferably in the amount of 20 to 60 percent by weight, in the cross-linking monomer (e), which contains two or more ethylenic unsaturated groups in a molecule and forms the composition of the present invention.

The compound represented by the above general formula (7) is preferable from the aspect of photosensitivity. However, while a dry film resist consisting of a photopolymerizble composition and obtained using a cross-linking monomer (e) wherein the content of this compound exceeds 85 percent by weight does have high photosensitivity, following peeling of the hardened resist using a strong alkali solution, the hardened resist peelings dissolve easily in the peeling fluid and, thus, this is not desirable.

It is preferable that the total percent by weight of the compounds represented by the above general formulas (6) and (7) which are contained in cross-linking monomer (e), which has two or more ethylenic unsaturated groups in a single molecule, be 65 percent by weight or greater. A dry film resist consisting of a photopolymerizable composition and obtained using a cross-linking monomer (e) wherein the total percent by weight of the compounds represented by the above general formulas (6) and (7) is less than 65 percent by weight shows a tendency towards decreased photosensitivity.

It is preferable that, of the 100 parts by weight of the visible light hardenable resin, 25 to 50 parts by weight, and preferably 30 to 45 parts by weight, thereof be comprised of the cross-linking monomer (e), which contains two or more ethylenic unsaturated groups in a single molecule and of which the composition of the present invention consists. In a visible light hardenable resin containing the cross-linking monomer (e) in an amount of less than 25 parts by weight, the obtained photopolymerizable composition does not harden sufficiently under visible light, chemical resistance decreases, swelling occurs in the developing process and it becomes difficult to obtain sufficient image dissection. In contrast, if the content of the cross-linking monomer (e) exceeds 50 parts by weight, cold flow occurs readily when the photopolymerizable composition is formed into the dry film resist. Moreover, there is a tendency for the peelability of the hardened film in an aqueous alkali solution to decrease.

Next, the dyes, lueco dyes, and radical generating agents which are selected from specific groups and are used in the present invention will be explained.

Dyes are added in order to provide contrast between nonirradiated portions and the substrate under red light. However, for this reason, it is necessary that these dyes absorb wavelengths between 600 to 700 nm of the radiation wavelength of red light, and that they have a maximum absorption wavelength between 550 to 700 nm. Additionally, in order to provide contrast between portions irradiated by the laser and portions not irradiated, it is desirable that there be a large difference in the absorption wavelength following coloring of the lueco dyes which will be explained below. Moreover, when mixing these dyes with visible light hardenable resin, the dye must be one which is highly stable and does not disappear or gel. Further, in order not to cause a decrease in the photosensitivity to a visible light laser, it is necessary that these dyes do not absorb the oscillation wavelength of the visible light laser used in the exposure.

Leuco dyes are added in order to provide contrast between the portions irradiated by the laser and the portions not irradiated. For this reason, it is desirable that the leuco dye undergo coloring under laser irradiation with a high degree of sensitivity, and that there be a large difference between the absorption wavelength of the leuco dye and the absorption wavelength of the dyes selected from the specified group as described above. Further, when mixing a leuco dye with a visible light hardenable resin, the dye must be one which is highly stable and does not disappear or gel. Moreover, the dye must not cause a decrease in the photosensitivity of the polymer composition.

As a result of their investigation of such dyes, leuco dyes and radical generating agents, the inventors of the present invention discovered that a combination of 4,4'-(phenylmethylene) bis [N,N-diethylbenezene amine] {Diamond Green, (Basic Green 1, C. I. 42040)}, as the leuco dye, tribromomethylphenyl sulfone, as the radical generating agent, and at least one dye selected from the group of phthalocyanine dyes, merocyanine dyes, monoazo dyes, anthraquinone dyes, and Victoria Pure Blue having a maximum absorption wavelength between 550 to 700 nm, in specific proportion is preferable.

Available as the anthraquinone dye having a maximum absorption wavelength between 550 to 700 nm are, for example, Solvent Blue 63, Disperse Blue 35, Disperse Blue 60, Disperse Blue 73, Disperse Blue 56, Solvent Blue 83, Solvent Blue 14, Solvent Blue 111, and the like. Available as the monoazo dyes are, for example, Solvent Blue 266, Disperse Blue 36, and Solvent Blue 268. Available as the merocyanine dyes is, for example, Disperse Blue 354. Available as the phthalocyanine dye is, for example, Solvent Blue 117. Victoria Blue is particularly preferable as the dye having a maximum absorption wavelength between 550 to 700 nm.

In general, in a system wherein a radical generating agent has been added to polymerizable composition which can be hardened by UV, the radical generating agent functions by disassociating under UV irradiation to generate a radical. This radical functions to promote the coloring of the leuco dye.

However, the tribromomethylphenyl sulfone which is added to the photopolymerizable composition of the present invention as the radical generating agent does not absorb the visible vibration wavelength of a visible light laser, such as an argon ion laser, and alone, is inactive under irradiation.

However, in comparison to the case where only Victoria Pure Blue, Lueco Diamond Green and the visible light hardenable resin are used, when tribromomethylphenyl sulfone was used simultaneously with, in particular, Lueco Diamond Green {4,4'-(phenylmethylene) bis[N,N-diethylbenezene amine] and the visible light hardenable resin, the coloring of the Lueco Diamond Green proceeded more quickly, good contrast between portions irradiated by the laser and portions not irradiated was provided and excellent stability was obtained.

The quantity of the dyes in the photopolymerizable composition of the present invention is 0.02 to 0.05 parts by weight with respect to 100 parts by weight of the visible light hardenable resin. When the quantity of the dye exceeds 0.5 parts by weight, good contrast cannot be obtained between the portions irradiated by the laser and the portions not irradiated. Likewise, when the quantity of the dye is less than 0.02 parts by weight, good contrast cannot be obtained between the substrate and portions not irradiated by the laser.

The quantity of the lueco dye 4,4'-(phenylmethylene) bis[N,N-diethylbenezene amine] (also known commonly by the name Leuco Diamond Green) is 0.1 to 5 parts by weight with respect to 100 parts by weight of the visible light hardenable resin. Even when the quantity of the aforementioned leuco dye exceeds 5 parts by weight, there is no improvement obtained in the contrast between the portions irradiated by the laser and the portions not irradiated. Not only is this economically undesirable, but there is often a decrease in the storage stability and in the physical properties after hardening.

Further, when the quantity of the lueco dye is less than 0.1 parts by weight, good contrast cannot be obtained between the portion irradiated by the laser and the portion not irradiated.

The quantity of the tribromomethylphenyl sulfone in the photopolymerizable composition of the present invention is 0.1 to 5 parts by weight with respect to 100 parts by weight of the visible light hardenable resin. Even when the quantity of the tribromomethylphenyl sulfone exceeds 5 parts by weight, there is no improvement obtained in the contrast between the portions irradiated by the laser and the portions not irradiated. Not only is this economically undesirable, but there is often a decrease in the storage stability and in the physical properties after hardening. Further, when the quantity of tribromomethylphenyl sulfone is less than 0.1 parts by weight, good contrast cannot be obtained between the portion irradiated by the laser and the portion not irradiated.

As stated above, the essential components of the photopolymerizable composition of the present invention are 4,4'-(phenylmethylene) bis[N,N-diethylbenezene amine] (commonly known as Leuco Diamond Green), tribromomethylphenyl sulfone, and at least one dye selected from the group of dyes including phthalocyanine dyes, merocyanine dyes, monoazo dyes, anthraquinone dyes, and Victoria Pure Blue having a maximum absorption wavelength between 550 to 700 nm, and a visible light hardenable resin. However, other additives such as a thermopolymerization inhibitors, adhesion enhancing agents, filling agents or plasticizers may be added as necessary.

The photopolymerizable composition of the present invention can be used in a variety of applications such as printing plates, photo resists and the like. However, it is particularly applicable to photosensitive image forming materials for plate making and photo resists. In these applications, the photopolymerizable composition of the present invention is, in general, dissolved in a solvent and, following this, coated to a supporting body and dried to form a film. After formation of the film, the photopolymerizable composition can be used after hardening under exposure to light.

The photopolymerizable composition of the present invention displays photosensitivity. However, when a high degree of photosensitivity is desired, in order to avoid polymerization inhibition by oxygen, exposure may be carried out under vacuum deaeration or nitrogen substitution, a polyvinyl alcohol film may be formed on the photopolymerizable composition, or a plastic film having low oxygen permeability properties may be laminated to the surface and then exposed to light.

The photopolymerizable composition of the present invention shows a wide photosensitivity distribution extending from wavelengths of approximately 220 nm to 550 nm. For this reason, hardening can be accomplished by using a light source such as the high pressure mercury lamps, xenon lamps, metal halide lamps and the like which have been used conventionally. However, the major characteristic feature of the present invention is that the photopolymerizable composition of the present invention is highly photosensitive to the vibration wavelength of a visible laser, for example, an argon ion laser, and can be hardened thereby, and, moreover, because good contrast can be provided between portions irradiated by the laser and portions not irradiated, a visible light laser, such as an argon ion laser, can be used in scanning exposure.

EXAMPLES

Below examples will be offered in order to explain the present invention in greater detail.

In the following examples and comparative examples, "part" and "parts" mean "part by weight" and "parts by weight", respectively.

(I) forming the photosensitive layer (test plate)

Solution of samples 1 through 44 of the photopolymerizable compositions consisting of the components shown in Tables 5, 6, 7, and 8 were prepared. The specifics of the binder resins, cross-linking monomers, dyes, and leuco dyes shown in Tables 5, 6, 7, and 8, are shown respectively in Tables 1, 2, 3, and 4.

Compounds A through G, the photopolymerization initiators, listed in Tables 5 and 6 have the respective chemical structures as shown below.

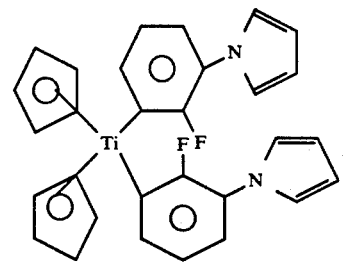

Compound A

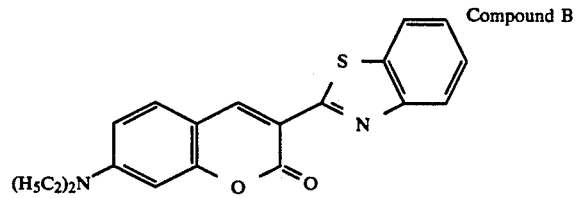

Compound B

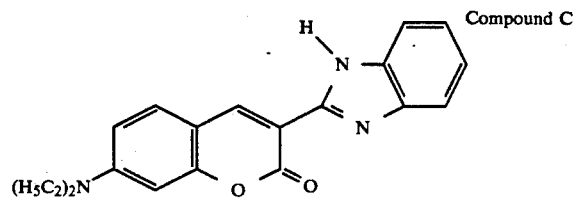

Compound C

-continued

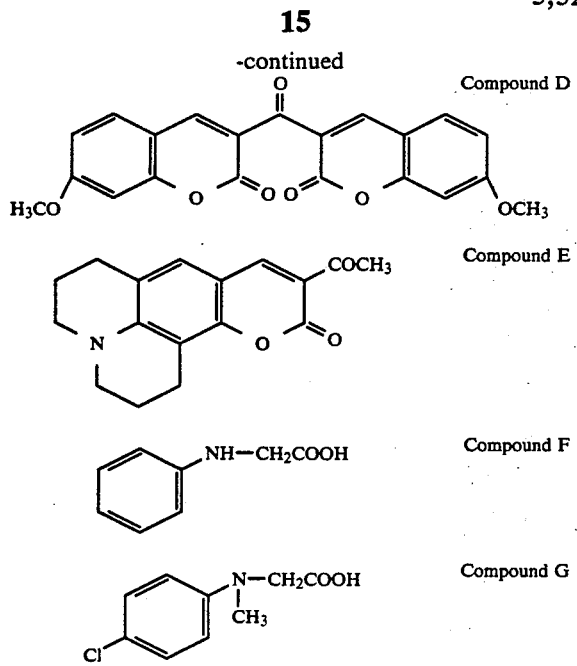

The polymer and monomer composition of binder resins 1 through 4 are shown in Table 1.

Cross-linking monomers 1 through 17 are shown in Table 2.

Dyes 1 through 18 are shown in Table 3.

Leuco dyes 1 through 5 are shown in Table 4.

Radical generating agent 1 is tribromomethylphenyl sulfone; radical generating agent 2 is 2,2'-bis(orthochlorophenyl) 4,5,4',5'-tetraphenylbiimidazole.

The obtained composition was coated onto a polyester film having a thickness of 25 μm using an applicator, and was then dried for 30 minutes in a 60° C. oven to yield a photopolymerizable composition layer having a thickness of 50 μm.

The obtained photopolymerizable composition layer was placed face down on a copper laminated plate, and was heat laminated onto the copper laminated plate, forming each of the test plates.

COMPARATIVE EXAMPLES

In the same manner as in the preceding examples, the photopolymerizable compositions of Comparative Examples 1 through 12 consisting of the components shown in Tables 9 and 10 were obtained, and test plates were formed.

(II) Measurement of Scanning Exposure Sensitivity

An 488 nm output of an argon laser (GLG 3028) produced by NEC Corporation was used as the light source. The test plates were exposed to a scanning laser light having a beam diameter which was concentrated at 35 μm using an optical system, and a 200 μm line-and-space pattern was described on the substrate. Next, the system was maintained as is for 30 minutes following light exposure. Then, the polyester film was peeled and ,from a distance of 10 cm from the substrate, a 1% sodium carbonate aqueous solution was sprayed on to the substrate at a spray pressure of 1.4 kg/cm² at 30° C. for 40 sec so as to dissolve and remove the unhardened portion, thereby obtaining on the substrate the scanning exposure pattern.

The scanning speed was systematically varied and the line width of the hardened portions of the scanning pattern were measured. At the scanning exposure speed at which a line width identical to the width of the scanning line was obtained, the irradiation energy per unit area at that time was calculated and set as the sensitivity.

These results are shown in Tables 11 and 12.

Additionally, the visibility of the resist portions before and after exposure to light under a red lamp was visually inspected and evaluated. These results are also shown in Tables 11 and 12.

(III) Evaluation of Insolubility of Peeled Pieces

In the same manner as in the above when measuring the scanning exposure sensitivity (II), each test plate underwent scanning exposure to light, hardening a 30×30 mm area on the plate. Following this, the hardened film was peeled with an aqueous solution of 3% sodium hydroxide at 45° C. Peeling was carried out at a spray pressure of 1.0 kg/cm² with a distance of 10 cm being maintained between the samples and the spray nozzle. In this manner, test peelings were formed.

The peelings were collected, placed in a beaker containing a 3% aqueous sodium hydroxide solution and sealed therein. After maintaining the beakers at 45° C. for 24 hours, a visual inspection was made to determine whether or not the peelings had dissolved. These results are also shown in Table 14.

(IV) Adhesion to Substrate

Adhesion between the pre-hardening resist and the copper laminated plate was evaluated for Examples 16, and 33 through 44. These results are also shown in Table 14.

The photopolymerizable compositions of Examples 1 through 44, consist of tribromomethylphenyl sulfone as the radical generating agent, 4,4'-(phenylmethylene) bis[N,N-diethylbenzene amine] (commonly known as Leuco Diamond Green) as the leuco dye, and at least one dye selected from the group of dyes including phthalocyanine dyes, merocyanine dyes, monoazo dyes, anthraquinone dyes, and Victoria Pure Blue having a maximum absorption wavelength between 550 to 700 nm. From the results in Tables 11 and 12, it can be confirmed that the photopolymerizable compositions of Examples 1 through 44 as described above have a high photosensitivity to visible light, provide good contrast between non-irradiated portions and the substrate under red light, and, moreover, also provide good contrast between portions irradiated by the laser and portions not irradiated. Further, these compositions also possess good stability.

In contrast, for the compositions used in Comparative Examples 1 through 4 which did not use a dye selected from the group of dyes including phthalocyanine dyes, merocyanine dyes, monoazo dyes, anthraquinone dyes, and Victoria Pure Blue having a maximum absorption wavelength between 550 to 700 nm, the following results were obtained. For the composition of Comparative Example 1 which combined no dyes, it was not possible to distinguish any difference between the resist and the copper surface under red light. For the composition of Comparative Example 2 which included Malachite Green as the dye, it was not possible to distinguish any difference between the resist and the copper surface under red light and, moreover, the Malachite Green disappeared. In the composition of Comparative Example 3 which included Crystal Violet as the dye, sensitivity was extremely poor. For the composition of Comparative Example 4 which included Methylene Blue as the dye, it was not possible to distinguish any difference between the resist and the copper surface under red light and, moreover, the Methylene Blue disappeared.

Further, in Comparative Examples 5 through 9 which did not use 4,4'-(phenylmethylene) bis[N,N-diethylbenzene amine] as the leuco dye, the following results were obtained. In the composition of Comparative Example 5 which did not include a leuco dye, no difference could be determined under red light between the portion exposed to light and the portion not exposed to light. In the composition of Comparative Example 6 which included Leuco Crystal Violet as the leuco dye, no difference could be determined under red light between the portion exposed to light and the portion not exposed to light, and, moreover, sensitivity was extremely poor and the Leuco Crystal Violet colored. In the composition of Comparative Example 7 which included Leuco Milling Green as the leuco dye, no difference could be determined under red light between the portion exposed to light and the portion not exposed to light. In the composition of Comparative Example 8 which included Leuco C. I. Basic Blue 1 as the leuco dye, there was a slight difference which could be determined under red light between the portion exposed to light and the portion not exposed to light. In the composition of Comparative Example 9 which included Leuco Malachite Green as the leuco dye, no difference could be determined under red light between the portion exposed to light and the portion not exposed to light.

Further, in the compositions of Comparative Example 10 through 12 which did not include tribromomethylphenyl sulfone as the radical generating agent, the following results were obtained. In the composition of Comparative Example 10, which contained no radical generating agent, a slight difference could be detected under red light between the portion exposed to light and the portion not exposed to light. In the compositions of Comparative Examples 11 and 12 which included 2,2'-bis(orthochlorophenyl) 4,5,4',5'-tetraphenylbiimidazole as the radical generating agent, in a visual inspection, no clear distinction under red light could be made between the portions exposed to light and the portions not exposed.

TABLE 1

| No. | Copolymerized monomer composition (weight ratio) |
|---|---|
| Binder resin 1 | Methacrylic acid/styrene/methyl acrylate/methyl methacrylate = 22.5/5/22.5/50 |
| Binder resin 2 | Methacrylic acid/styrene/methyl acrylate/methyl methacrylate = 20/10/25/45.0 |
| Binder resin 3 | Methacrylic acid/styrene/methyl acrylate/methyl methacrylate = 20/0/20/60.0 |
| Binder resin 4 | Methacrylic acid/styrene/methyl acrylate/methyl methacrylate = 20/5/22.5/52.5 |

TABLE 2

| No. | |
|---|---|
| Closs-linking monomer 1 | Tetraethylene glycol diacrylate *1) |
| Closs-linking monomer 2 | Tetraethylene glycol dimethyacrylate *2) |
| Closs-linking monomer 3 | Polypropylene glycol diacrylate *3) |
| Closs-linking monomer 4 | Trimethylolpropane triethoxyacrylate *4) |
| Closs-linking monomer 5 | Propylene glycol diglycidylether diacrylate *5) |
| Closs-linking monomer 6 | Triethylene glycol dimethacrylate |
| Closs-linking monomer 7 | Heneicosa ethylene glycol dimethacrylate |

*1) Product name: NK-ESTER A-200 (molecular weight = about 308. Shin Nakamura Chemical Industrial Co., Ltd.)
*2) Product name: NK-ESTER 4G (molecular weight = about 320. Shin Nakamura Chemical Industrial Co., Ltd.)
*3) Product name: NK-ESTER APG-400 (molecular weight = about 536. Shin Nakamura Chemical Industrial Co., Ltd.)
*4) Product name: BISCOAT 360 (Osaka Organic Chemical Ind. Co., Ltd.)
*5) Product name: DENACORACLYRATE DA-911 (Nagase Chemicals Ind. Co., Ltd.)

TABLE 3

| No. | C.I. name | Basic structure |
|---|---|---|
| Dye 1 | Solvent Blue 63 | Anthraquinone |
| Dye 2 | Solvent Blue 266 | Monoazo |
| Dye 3 | Solvent Blue 268 | Monoazo |
| Dye 4 | Disperse Blue 354 | Anthraquinone |
| Dye 5 | Disperse Blue 35 | Anthraquinone |
| Dye 6 | Disperse Blue 36 | Monoazo |
| Dye 7 | Disperse Blue 60 | Anthraquinone |
| Dye 8 | Disperse Blue 73 | Anthraquinone |
| Dye 9 | Disperse Blue 56 | Anthraquinone |
| Dye 10 | Solvent Blue 83 | Anthraquinone |
| Dye 11 | Solvent Blue 25 | Phthalocyanine |
| Dye 12 | Solvent Blue 14 | Anthraquinone |
| Dye 13 | Solvent Blue 117 | Phthalocyanine |
| Dye 14 | Solvent Blue 111 | Anthraquinone |
| Dye 15 | Basic Blue 7 (Victoria Pure Blue) | Triphenylmethane |
| Dye 16 | Basic Green 4 (Malachite Green) | Triphenylmethane |
| Dye 17 | Basic Violet 3 (Crystal Violet) | Triphenylmethane |
| Dye 18 | Basic Blue 9 (Methylene Blue) | Acridine |

TABLE 4

| No. | |
|---|---|
| Leuco dye 1 | (4,4'-phenylmethylene)bis[N,N-dimethylbenzen amine] (Leuco Diamond Green) |
| Leuco dye 2 | Leuco Crystal Violet |
| Leuco dye 3 | Leuco Milling Green |
| Leuco dye 4 | Leuco C.I. Basic Blue |
| Leuco dye 5 | Leuco Malachite Green |

TABLE 5

| | Cross-linking monomer | | Binder resin | | Visible light hardenable resin (a) | | | | Photopolymerization initiator | | | |
|---|---|---|---|---|---|---|---|---|---|---|---|---|
| | Cross-linking monomer No. | | Binder resin No. | | Compound (a) | | Compound (b) | | Compound (c) | | Compound F | Compound G |
| | | | | | Compound A | | Compound B | Compound C | Compound D | Compound E | | |
| Example 1 | 1 | 38.58 parts | 1 | 60.62 parts | 0.7 part | | 0.1 part | | | | | |
| Example 2 | 1 | 38.58 parts | 1 | 60.62 parts | 0.7 part | | | 0.1 part | | | | |
| Example 3 | 1 | 38.58 parts | 1 | 60.62 parts | 0.7 part | | 0.1 part | | | | | |
| Example 4 | 1 | 38.58 parts | 1 | 60.62 parts | 0.7 part | | | 0.1 part | | | | |
| Example 5 | 3 | 38.58 parts | 1 | 60.62 parts | 0.7 part | | 0.1 part | | | | | |
| Example 6 | 3 | 38.58 parts | 1 | 60.62 parts | 0.7 part | | | 0.1 part | | | | |
| Example 7 | 1 | 38.58 parts | 2 | 60.62 parts | 0.7 part | | 0.1 part | | | | | |
| Example 8 | 1 | 38.58 parts | 2 | 60.62 parts | 0.7 part | | 0.1 part | | | | | |
| Example 9 | 1 | 38.58 parts | 2 | 60.62 parts | 0.7 part | | 0.1 part | | | | | |
| Example 10 | 1 | 38.58 parts | 2 | 60.62 parts | 0.7 part | | 0.1 part | | | | | |
| Example 11 | 1 | 38.58 parts | 2 | 60.62 parts | 0.7 part | | 0.1 part | | | | | |
| Example 12 | 1 | 38.58 parts | 2 | 60.62 parts | 0.7 part | | 0.1 part | | | | | |
| Example 13 | 1 | 38.58 parts | 2 | 60.62 parts | 0.7 part | | 0.1 part | | | | | |
| Example 14 | 1 | 38.58 parts | 2 | 60.62 parts | 0.7 part | | 0.1 part | | | | | |
| Example 15 | 1 | 38.58 parts | 2 | 30.31 parts | 0.7 part | | 0.1 part | | | | | |
| Example 16 | 1<br>2<br>4<br>5 | 15.16 parts<br>15.16 parts<br>2.76 parts<br>5.51 parts | 3 | 30.31 parts | 0.7 part | | 0.1 part | | | | | |
| Example 17 | 1<br>2<br>4<br>5 | 15.16 parts<br>15.16 parts<br>2.76 parts<br>5.51 parts | 2<br>3 | 30.31 parts<br>30.31 parts | 0.7 part | | 0.1 part | | | | | |
| Example 18 | 1<br>2<br>4<br>5 | 15.16 parts<br>15.16 parts<br>2.76 parts<br>5.51 parts | 2<br>3 | 30.31 parts<br>30.31 parts | 0.7 part | | 0.1 part | | | | | |
| Example 19 | 1<br>2<br>4<br>5 | 15.16 parts<br>15.16 parts<br>2.76 parts<br>5.51 parts | 2<br>3 | 30.31 parts<br>30.31 parts | 0.7 part | | 0.1 part | | | | | |
| Example 20 | 1<br>2<br>4<br>5 | 15.16 parts<br>15.16 parts<br>2.76 parts<br>5.51 parts | 2<br>3 | 30.31 parts<br>30.31 parts | 0.7 part | | 0.1 part | | | | | |
| Example 21 | 1<br>2<br>4<br>5 | 15.16 parts<br>15.16 parts<br>2.76 parts<br>5.51 parts | 2<br>3 | 30.31 parts<br>30.31 parts | 0.7 part | | 0.1 part | | | | | |
| Example 22 | 1<br>2<br>4<br>5 | 15.16 parts<br>15.16 parts<br>2.76 parts<br>5.51 parts | 2<br>3 | 30.31 parts<br>30.31 parts | 0.7 part | | | 0.1 part | | | | |

TABLE 6

| | Photopolymerizable composition | | | | | | |
|---|---|---|---|---|---|---|---|
| | Dye | | Leuco dye | | Radical generator | | |
| | Dye No. | | Leuco dye No. | | Radical generator No. | | Solvent MEK:IPA = 4:1 |
| Example 1 | 15 | 0.03 part | 1 | 0.87 part | 1 | 0.25 part | 112.42 parts |
| Example 2 | 15 | 0.03 part | 1 | 0.87 part | 1 | 0.25 part | 112.42 parts |
| Example 3 | 15 | 0.03 part | 1 | 0.44 part | 1 | 0.25 part | 112.42 parts |
| Example 4 | 15 | 0.03 part | 1 | 0.44 part | 1 | 0.25 part | 112.42 parts |
| Example 5 | 15 | 0.03 part | 1 | 0.87 part | 1 | 0.25 part | 112.42 parts |
| Example 6 | 15 | 0.03 part | 1 | 0.87 part | 1 | 0.25 part | 112.42 parts |
| Example 7 | 1 | 0.106 part | 1 | 0.87 part | 1 | 0.25 part | 112.42 parts |
| Example 8 | 2 | 0.283 part | 1 | 0.87 part | 1 | 0.25 part | 112.42 parts |
| Example 9 | 3 | 0.250 part | 1 | 0.87 part | 1 | 0.25 part | 112.42 parts |
| Example 10 | 4 | 0.042 part | 1 | 0.87 part | 1 | 0.25 part | 112.42 parts |
| Example 11 | 5 | 0.100 part | 1 | 0.87 part | 1 | 0.25 part | 112.42 parts |
| Example 12 | 6 | 0.106 part | 1 | 0.87 part | 1 | 0.25 part | 112.42 parts |
| Example 13 | 7 | 0.228 part | 1 | 0.87 part | 1 | 0.25 part | 112.42 parts |
| Example 14 | 8 | 0.378 part | 1 | 0.87 part | 1 | 0.25 part | 112.42 parts |
| Example 15 | 9 | 0.450 part | 1 | 0.87 part | 1 | 0.25 part | 112.42 parts |
| Example 16 | 10 | 0.150 part | 1 | 0.87 part | 1 | 0.25 part | 112.42 parts |
| Example 17 | 11 | 0.228 part | 1 | 0.87 part | 1 | 0.25 part | 112.42 parts |
| Example 18 | 12 | 0.100 part | 1 | 0.87 part | 1 | 0.25 part | 112.42 parts |
| Example 19 | 13 | 0.206 part | 1 | 0.87 part | 1 | 0.25 part | 112.42 parts |
| Example 20 | 14 | 0.139 part | 1 | 0.87 part | 1 | 0.25 part | 112.42 parts |
| Example 21 | 15 | 0.042 part | 1 | 0.87 part | 1 | 0.25 part | 112.42 parts |
| Example 22 | 15 | 0.042 part | 1 | 0.87 part | 1 | 0.25 part | 112.42 parts |

TABLE 7

| | Cross-linking monomer | | Binder resin | | Visible light hardenable resin (a) | | Photopolymerization initiator | | | | |
|---|---|---|---|---|---|---|---|---|---|---|---|
| | | | | | Compound (a) | | Compound (b) | | | Compound (c) | |
| | Cross-linking monomer No. | | Binder resin No. | | Compound A | Compound B | Compound C | Compound D | Compound E | Compound F | Compound G |
| Example 23 | 1 | 38.58 parts | 1 | 60.62 parts | 0.7 part | | | | | 0.7 part | |
| Example 24 | 1 | 38.58 parts | 1 | 60.62 parts | 0.7 part | | | | | | 0.7 part |
| Example 25 | 1 | 38.58 parts | 1 | 60.62 parts | 0.9 part | | 0.9 part | | | | |
| Example 26 | 1 | 38.58 parts | 1 | 60.62 parts | 0.46 part | | | | | 8.20 parts | |
| Example 27 | 3 | 38.58 parts | 1 | 60.62 parts | 0.7 part | 0.1 part | | | | 0.46 part | |
| Example 28 | 3 | 38.58 parts | 1 | 60.62 parts | 0.7 part | 0.07 part | | | | 0.72 part | |
| Example 29 | 1 | 38.58 parts | 2 | 60.62 parts | 0.7 part | 0.07 part | | | | | 0.72 part |
| Example 30 | 1 | 38.58 parts | 2 | 60.62 parts | 0.7 part | | 0.07 part | | | 0.72 part | |
| Example 31 | 1 | 38.58 parts | 2 | 60.62 parts | 0.7 part | | 0.07 part | | | | 0.72 part |
| Example 32 | 1 | 38.58 parts | 2 | 60.62 parts | 0.75 part | 0.25 part | | | | | |
| Example 33 | 2 | 38.58 parts | 4 | 60.62 parts | 0.75 part | 0.25 part | | | | | |
| Example 34 | 1 | 19.25 parts | 4 | 60.62 parts | 0.75 part | | | 0.07 part | | | |
| Example 35 | 2 | 19.25 parts | 1 | 60.62 parts | 0.75 part | | | | 0.07 part | | |
| Example 36 | 1 | 15.10 parts | 1 | 60.62 parts | 0.75 part | 0.25 part | | | | | |
| | 2 | 7.60 parts | 3 | 30.31 parts | | | | | | | |
| | 4 | 2.70 parts | | | | | | | | | |
| | 5 | 5.50 parts | | | | | | | | | |
| Example 37 | 1 | 22.80 parts | 1 | 60.62 parts | 0.75 part | 0.25 part | | | | | |
| | 2 | 7.50 parts | | | | | | | | | |
| | 4 | 2.70 parts | | | | | | | | | |
| | 5 | 5.50 parts | | | | | | | | | |
| Example 38 | 1 | 38.58 parts | 1 | 60.62 parts | 0.75 part | 0.25 part | | | | | |
| | 4 | 2.70 parts | | | | | | | | | |
| | 5 | 5.50 parts | | | | | | | | | |
| Example 39 | 6 | 30.30 parts | 1 | 60.62 parts | 0.75 part | 0.25 part | | | | | |
| | 4 | 2.70 parts | | | | | | | | | |
| | 5 | 5.50 parts | | | | | | | | | |
| Example 40 | 7 | 30.30 parts | 1 | 60.62 parts | 0.75 part | 0.25 part | | | | | |
| | 4 | 2.70 parts | | | | | | | | | |
| | 5 | 5.50 parts | | | | | | | | | |
| Example 41 | 3 | 30.30 parts | 1 | 60.62 parts | 0.75 part | 0.25 part | | | | | |
| | 1 | 27.60 parts | | | | | | | | | |
| | 2 | 2.70 parts | | | | | | | | | |
| | 4 | 2.70 parts | | | | | | | | | |
| | 5 | 5.50 parts | | | | | | | | | |
| Example 42 | 1 | 15.10 parts | 1 | 60.62 parts | 0.75 part | 0.25 part | | | | | |
| | 3 | 15.10 parts | | | | | | | | | |
| | 4 | 2.80 parts | | | | | | | | | |
| | 5 | 5.50 parts | | | | | | | | | |
| Example 43 | 1 | 10.60 parts | 1 | 72.00 parts | 0.75 part | 0.25 part | | | | | |
| | 2 | 10.60 parts | | | | | | | | | |
| | 4 | 1.90 parts | | | | | | | | | |
| | 5 | 3.90 parts | | | | | | | | | |
| Example 44 | 1 | 24.80 parts | 1 | 36.00 parts | 0.75 part | 0.25 part | | | | | |
| | 2 | 24.80 parts | | | | | | | | | |
| | 4 | 4.40 parts | | | | | | | | | |
| | 5 | 9.00 parts | | | | | | | | | |

TABLE 8

| | Photopolymerizable composition | | | | | |
|---|---|---|---|---|---|---|
| | Dye | | Leuco dye | | Radical generator | |
| | Dye No. | | Leuco dye No. | | Radical generator No. | Solvent MEK:IPA = 4:1 |
| Example 23 | 15 | 0.03 part | 1 | 0.87 part | 1 | 0.25 part | 112.42 parts |
| Example 24 | 15 | 0.03 part | 1 | 0.87 part | 1 | 0.25 part | 112.42 parts |
| Example 25 | 15 | 0.03 part | 1 | 0.87 part | 1 | 0.25 part | 112.42 parts |
| Example 26 | 15 | 0.03 part | 1 | 0.87 part | 1 | 0.25 part | 112.42 parts |
| Example 27 | 15 | 0.03 part | 1 | 0.87 part | 1 | 0.25 part | 112.42 parts |
| Example 28 | 15 | 0.03 part | 1 | 0.87 part | 1 | 0.25 part | 112.42 parts |
| Example 29 | 15 | 0.03 part | 1 | 0.87 part | 1 | 0.25 part | 112.42 parts |
| Example 30 | 15 | 0.03 part | 1 | 0.87 part | 1 | 0.25 part | 112.42 parts |
| Example 31 | 15 | 0.03 part | 1 | 0.87 part | 1 | 0.25 part | 112.42 parts |
| Example 32 | 15 | 0.03 part | 1 | 0.87 part | 1 | 0.25 part | 112.42 parts |
| Example 33 | 15 | 0.03 part | 1 | 0.87 part | 1 | 0.25 part | 112.42 parts |
| Example 34 | 15 | 0.03 part | 1 | 0.87 part | 1 | 0.25 part | 112.42 parts |
| Example 35 | 15 | 0.03 part | 1 | 0.87 part | 1 | 0.25 part | 112.42 parts |
| Example 36 | 15 | 0.03 part | 1 | 0.87 part | 1 | 0.25 part | 112.42 parts |
| Example 37 | 15 | 0.03 part | 1 | 0.87 part | 1 | 0.25 part | 112.42 parts |
| Example 38 | 15 | 0.03 part | 1 | 0.87 part | 1 | 0.25 part | 112.42 parts |
| Example 39 | 11 | 0.03 part | 1 | 0.87 part | 1 | 0.25 part | 112.42 parts |
| Example 40 | 15 | 0.03 part | 1 | 0.87 part | 1 | 0.25 part | 112.42 parts |
| Example 41 | 15 | 0.03 part | 1 | 0.87 part | 1 | 0.25 part | 112.42 parts |
| Example 42 | 15 | 0.03 part | 1 | 0.87 part | 1 | 0.25 part | 112.42 parts |
| Example 43 | 15 | 0.03 part | 1 | 0.87 part | 1 | 0.25 part | 112.42 parts |
| Example 44 | 15 | 0.03 part | 1 | 0.87 part | 1 | 0.25 part | 112.42 parts |

TABLE 9

| | Cross-linking monomer | Binder resin | | Visible light hardenable resin (a) | | Photopolymerization initiator | | | | | |
|---|---|---|---|---|---|---|---|---|---|---|---|
| | Cross-linking monomer No. | Binder resin No. | | Compound (a) | | Compound (b) | | | | Compound (c) | |
| | | | | Compound A | Compound B | Compound C | Compound D | Compound E | | Compound F | Compound G |
| Comparative Example 1 | 1 | 1 | 60.62 parts | 0.7 part | 0.1 part | | | | | | |
| Comparative Example 2 | 1 | 1 | 60.62 parts | 0.7 part | 0.1 part | | | | | | |
| Comparative Example 3 | 1 | 1 | 60.62 parts | 0.7 part | 0.1 part | | | | | | |
| Comparative Example 4 | 1 | 1 | 60.62 parts | 0.7 part | 0.1 part | | | | | | |
| Comparative Example 5 | 1 | 1 | 60.62 parts | 0.7 part | 0.1 part | | | | | | |
| Comparative Example 6 | 1 | 1 | 60.62 parts | 0.7 part | 0.1 part | | | | | | |
| Comparative Example 7 | 1 | 1 | 60.62 parts | 0.7 part | 0.1 part | | | | | | |
| Comparative Example 8 | 1 | 1 | 60.62 parts | 0.7 part | 0.1 part | | | | | | |
| Comparative Example 9 | 1 | 1 | 60.62 parts | 0.7 part | 0.1 part | | | | | | |
| Comparative Example 10 | 1 | 1 | 60.62 parts | 0.7 part | 0.1 part | | | | | | |
| Comparative Example 11 | 1 | 1 | 60.62 parts | 0.7 part | | | | | 0.1 part | | |
| Comparative Example 12 | 1 | 1 | 60.62 parts | 0.7 part | | | | | | | |

TABLE 10

| | Dye | | Leuco dye | | Radical generator | | Solvent |
|---|---|---|---|---|---|---|---|
| | Dye No. | | Leuco dye No. | | Radical generator No. | | MEK:IPA = 4:1 |
| Comparative Example 1 | | | 1 | 0.87 part | 1 | 0.25 part | 112.42 parts |
| Comparative Example 2 | 16 | 0.03 part | 1 | 0.87 part | 1 | 0.25 part | 112.42 parts |
| Comparative Example 3 | 17 | 0.03 part | 1 | 0.87 part | 1 | 0.25 part | 112.42 parts |
| Comparative Example 4 | 18 | 0.03 part | 1 | 0.87 part | 1 | 0.25 part | 112.42 parts |
| Comparative Example 5 | 15 | 0.03 part | | | 1 | 0.25 part | 112.42 parts |
| Comparative Example 6 | 15 | 0.03 part | 2 | 0.87 part | 1 | 0.25 part | 112.42 parts |
| Comparative Example 7 | 15 | 0.03 part | 3 | 0.87 part | 1 | 0.25 part | 112.42 parts |
| Comparative Example 8 | 15 | 0.03 part | 4 | 0.87 part | 1 | 0.25 part | 112.42 parts |
| Comparative Example 9 | 15 | 0.03 part | 5 | 0.87 part | 1 | 0.25 part | 112.42 parts |
| Comparative Example 10 | 15 | 0.03 part | 1 | 0.87 part | | | 112.42 parts |
| Comparative Example 11 | 15 | 0.03 part | 1 | 0.87 part | 2 | 0.25 part | 112.42 parts |
| Comparative Example 12 | 15 | 0.03 part | 1 | 0.87 part | 2 | 0.25 part | 112.42 parts |

TABLE 11

| | Efficiency Sensitivity | Visibility Pre-exposure 1) | Visibility Post-exposure 2) | Stability |
|---|---|---|---|---|
| Example 1 | 4 mJ/cm² | ⊚ | ⊚ | ○ |
| Example 2 | 5 mJ/cm² | ⊚ | ⊚ | ○ |
| Example 3 | 4 mJ/cm² | ⊚ | ⊚ | ○ |
| Example 4 | 5 mJ/cm² | ⊚ | ⊚ | ○ |
| Example 5 | 10 mJ/cm² | ⊚ | ⊚ | ○ |
| Example 6 | 12.5 mJ/cm² | ⊚ | ⊚ | ○ |
| Example 7 | 4 mJ/cm² | ⊚ | ⊚ | ○ |
| Example 8 | 4 mJ/cm² | ⊚ | ⊚ | ○ |
| Example 9 | 4 mJ/cm² | ⊚ | ⊚ | ○ |
| Example 10 | 4 mJ/cm² | ⊚ | ⊚ | ○ |
| Example 11 | 4 mJ/cm² | ⊚ | ⊚ | ○ |
| Example 12 | 4 mJ/cm² | ⊚ | ⊚ | ○ |
| Example 13 | 4 mJ/cm² | ⊚ | ⊚ | ○ |
| Example 14 | 4 mJ/cm² | ⊚ | ⊚ | ○ |
| Example 15 | 4 mJ/cm² | ⊚ | ⊚ | ○ |
| Example 16 | 8 mJ/cm² | ⊚ | ⊚ | ○ |
| Example 17 | 8 mJ/cm² | ⊚ | ⊚ | ○ |
| Example 18 | 8 mJ/cm² | ⊚ | ⊚ | ○ |
| Example 19 | 8 mJ/cm² | ⊚ | ⊚ | ○ |
| Example 20 | 8 mJ/cm² | ⊚ | ⊚ | ○ |
| Example 21 | 8 mJ/cm² | ⊚ | ⊚ | ○ |
| Example 22 | 8 mJ/cm² | ⊚ | ⊚ | ○ |

TABLE 12

| | Efficiency Sensitivity | Visibility Pre-exposure 1) | Visibility Post-exposure 2) | Stability |
|---|---|---|---|---|
| Example 23 | 2 mJ/cm² | ⊚ | ⊚ | ○ |
| Example 24 | 2 mJ/cm² | ⊚ | ⊚ | ○ |
| Example 25 | 1.5 mJ/cm² | ⊚ | ⊚ | ○ |
| Example 26 | 3 mJ/cm² | ⊚ | ⊚ | ○ |
| Example 27 | 1.5 mJ/cm² | ⊚ | ⊚ | ○ |
| Example 28 | 1.5 mJ/cm² | ⊚ | ⊚ | ○ |
| Example 29 | 1.5 mJ/cm² | ⊚ | ⊚ | ○ |
| Example 30 | 1.5 mJ/cm² | ⊚ | ⊚ | ○ |
| Example 31 | 1.5 mJ/cm² | ⊚ | ⊚ | ○ |
| Example 32 | 1.5 mJ/cm² | ⊚ | ⊚ | ○ |
| Example 33 | 9 mJ/cm² | ⊚ | ⊚ | ○ |
| Example 34 | 8 mJ/cm² | ⊚ | ⊚ | ○ |
| Example 35 | 8 mJ/cm² | ⊚ | ⊚ | ○ |
| Example 36 | 8 mJ/cm² | ⊚ | ⊚ | ○ |
| Example 37 | 8 mJ/cm² | ⊚ | ⊚ | ○ |
| Example 38 | 12 mJ/cm² | ⊚ | ⊚ | ○ |
| Example 39 | 15 mJ/cm² | ⊚ | ⊚ | ○ |
| Example 40 | 15 mJ/cm² | ⊚ | ⊚ | ○ |
| Example 41 | 7 mJ/cm² | ⊚ | ⊚ | ○ |
| Example 42 | 10 mJ/cm² | ⊚ | ⊚ | ○ |
| Example 43 | 8 mJ/cm² | ⊚ | ⊚ | ○ |
| Example 44 | 10 mJ/cm² | ⊚ | ⊚ | ○ |

1) ⊚: There was a clear difference distinguishable by eyes between a resist and a copper surface under red light.
○: There was a difference distinguishable by eyes between a resist and a copper surface under red light.
Δ: There was a little difference distinguishable between a resist and a copper surface under red light.
×: There was no difference distinguishable between a resist and a copper surface under red light.

2) ⊚: There was a clear difference distinguishable by eyes between exposed portion and unexposed portion under red light.
○: There was a difference distinguishable by eyes between exposed portion and unexposed portion under red light.
Δ: There was a little difference distinuishable between exposed portion and unexposed portion under red light.
×: There was no difference distinguishable between and exposed portion and unexposed portion under red light.

TABLE 13

| | Efficiency Sensitivity | Visibility Pre-exposure 1) | Visibility Post-exposure 2) | Stability |
|---|---|---|---|---|
| Comparative Example 1 | 4 mJ/cm² | x | ○ | ○ |
| Comparative Example 2 | 4 mJ/cm² | x | ○ | x 3) |
| Comparative Example 3 | 25 mJ/cm² | ○ | ○ | ○ |
| Comparative Example 4 | 6 mJ/cm² | x | ○ | x 4) |
| Comparative Example 5 | 4 mJ/cm² | ◎ | x | ○ |
| Comparative Example 6 | 40 mJ/cm² | ◎ | x | x 5) |
| Comparative Example 7 | 4 mJ/cm² | ◎ | x | ○ |
| Comparative Example 8 | 4 mJ/cm² | ◎ | Δ | ○ |
| Comparative Example 9 | 5 mJ/cm² | ◎ | x | ○ |
| Comparative Example 10 | 4 mJ/cm² | ◎ | x | ○ |
| Comparative Example 11 | 4 mJ/cm² | ◎ | ○ | ○ |
| Comparative Example 12 | 5 mJ/cm² | ◎ | ○ | ○ |

1) ◎: There was a clear difference distinguishable by eyes between a resist and a copper surface under red light.
○: There was a difference distinguishable by eyes between a resist and a copper surface under red light.
Δ: There was a little difference distinguishable between a resist and a copper surface under red light.
x: There was no difference distinguishable between a resist and a copper surface under red light.
2) ◎: There was a clear difference distinguishable by eyes between exposed portion and unexposed portion under red light.
○: There was a difference distinguishable by eyes between exposed portion and unexposed portion under red light.
Δ: There was a little difference distinuishable between exposed portion and unexposed portion under red light.
x: There was no difference distinguishable between and exposed portion and unexposed portion under red light.
3) Malachite Green discolored.
4) Methylene Blue discolored.
5) Leuco Crystal Violet colored.

TABLE 14

| | Sensitivity | Evaluation Insolubility of peeled pieces 1) | Evaluation Sticking property with a substrate 2) |
|---|---|---|---|
| Example 16 | 8 mJ/cm² | ○ | ○ |
| Example 33 | 9 mJ/cm² | ○ | ○ |
| Example 34 | 8 mJ/cm² | ○ | ○ |
| Example 35 | 8 mJ/cm² | ○ | ○ |
| Example 36 | 8 mJ/cm² | ○ | ○ |
| Example 37 | 6 mJ/cm² | x | ○ |
| Example 38 | 12 mJ/cm² | ○ | ○ |
| Example 39 | 15 mJ/cm² | ○ | ○ |
| Example 40 | 15 mJ/cm² | Δ | ○ |
| Example 41 | 7 mJ/cm² | x | ○ |
| Example 42 | 10 mJ/cm² | x | ○ |
| Example 43 | 8 mJ/cm² | ○ | x |
| Example 44 | 10 mJ/cm² | ○ | x |

1) ○: Almost no change was observed.
Δ: Peeled pieces were expanded.
x: Peeled pieces were dissolved.
2) ○: The resist did not stick to the substrate without pressing at room temperature, and sticked completely to the substrate after laminating.
x: The resist sticked to the substrate without pressing at room temperature, or did not stick completely to the substrate after laminating.

What is claimed is:

1. A photopolymerizable composition comprising of a combination of:
   100 parts by weight of a resin which is hardenable under visible light which has an irradiation energy mainly of light rays in the visible light region of 400 nm to 700 nm;
   0.02 to 0.5 parts by weight of at least one dye selected from the group consisting of Victoria Pure Blue, anthraquinone dyes, monoazo dyes, merocyanine dyes and phthalocyanine dyes, which have a maximum absorption wavelength from 550 to 700 nm;
   0.1 to 5 parts by weight of 4,4'-(phenylmethylene) bis[N,N-diethylbenzene amine]; and
   0.1 to 5 parts by weight of tribromomethylphenyl sulfone.

2. A photopolymerizable composition according to claim 1 wherein said visible light hardenable resin contains as a photosensitive photopolymerization initiator, a combination of a compound (a), a compound (b) and-/or a compound (c), wherein:
   said compound (a) is represented by the following general formula (1)

(1)

where,
$R^1$ represents respectively and independently, 4,5,6,7 tetrahydroindenyl⁻, indenyl⁻, or cyclopentadienyl⁻, which is either non-substituted or substituted with an alkyl having 1 to 6 carbon atoms or an alkoxy having 1 to 6 carbon atoms, or alternatively, respective $R^1$ groups may be joined to form a compound as represented by the following formula (2) below, wherein $R^4$ and $R^5$ represent respectively and independently, hydrogen or methyl;

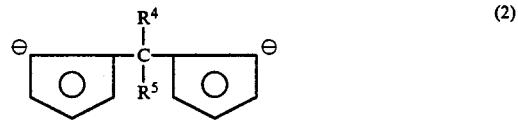

(2)

$R^2$ is an aromatic ring with a 6-membered carbon ring or with a 5- or 6-membered hetero ring, wherein at least one of the two ortho positions of the metal-carbon bond is substituted with a fluorine atom or a —$CF_2R$ group where R is fluorine or methyl,
$R^3$ is identical to $R^2$, or is a halogen atom, —$OR^6$ or —$OR^7$ where $R^6$ is hydrogen, an alkyl having 1 to 6 carbon atoms, phenyl, acetyl, or trifluoroacetyl, and $R^7$ is an alkyl having 1 to 6 carbons atoms or phenyl, or $R^3$ is a group shown by formula (3) below which is formed by joining $R^2$ and $R^3$,

(3)

where Q is an aromatic ring with a 6-membered carbon ring or an aromatic ring with a 5- or 6-membered hetero ring, where each two bonds are in an ortho position with respect to Y, each meta position with respect to Y is substituted with a fluorine atom or a —$CF_2R$ group, and Y is a direct bond, —O—, —S—, —$SO_2$—, —CO—, —$CH_2$—, or —$C(CH_3)_2$—;
said compound (b) is represented by the following general formula (4)

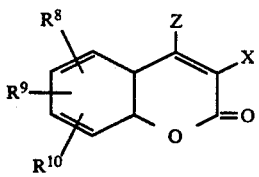 (4)

where, $R^8$, $R^9$, and $R^{10}$ represent respectively and independently, hydrogen atom, chlorine atom, a lower alkoxy group, lower dialkyl amino group, lower dialkenyl amino group, or alicyclic amino group, or alternatively, when joined, $R^8$, $R^9$, and $R^{10}$ represent a substituted or non-substituted alicyclic amino group where X indicates a heterocyclic group, non-substituted or substituted with a total of 5 to 9 carbon atoms and hetero atoms, and Z indicates a hydrogen atom or amino group;

and said compound (c) is a compound as shown by the following general formula (5)

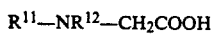 (5)

where, $R^{11}$ indicates phenyl group or substituted phenyl group, and $R^{12}$ indicates hydrogen atom, lower alkyl group, chlorine atom or lower alkoxy group.

3. A photopolymerizable coposition according to one of either claims 1 and 2, wherein said visible light hardenable resin consists essentially of:

40 to 70 parts by weight of a thermoplastic polymer (d) for use in a binder, wherein 15 to 30 percent by weight of at least one monomer containing an $\alpha,\beta$ unsaturated carboxyl group having 3 to 15 carbon atoms is copolymerized with 85 to 70 percent by weight of other copolymerizable monomer therewith;

25 to 50 parts by weight of a cross-linking monomer (e) containing two or more ethylenic unsaturated groups within the molecule;

0.5 to 10 parts by weight of a visible light photopolymerization initiator (f), wherein, said cross-linking monomer (e) contains 15 to 10 percent by weight of the compound shown by the general formula (6) below, 0 to 85 percent by weight of the compound shown by the general formula (7) below, and, moreover, wherein the total percent by weight for the compound shown by general formula (6) and the compound shown by general formula (7) is 65 percent by weight or more with respect to the cross-linking monomer (e)

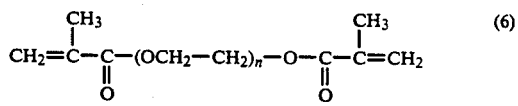 (6)

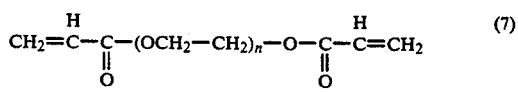 (7)

wherein n is a positive integer in the range of 4 to 9.

* * * * *